United States Patent [19]

Osaka

[11] Patent Number: 5,319,675
[45] Date of Patent: Jun. 7, 1994

[54] QUADRATURE MODULATION CIRCUIT

[75] Inventor: Masahiko Osaka, Tokyo, Japan

[73] Assignee: NEC Corporation, Japan

[21] Appl. No.: 968,841

[22] Filed: Oct. 30, 1992

[30] Foreign Application Priority Data

Oct. 30, 1991 [JP] Japan .................. 3-311640

[51] Int. Cl.$^5$ ............................ H04L 27/04
[52] U.S. Cl. ......... ............... 375/59; 332/117; 332/103
[58] Field of Search .............. 375/39, 59, 60; 332/104, 100, 117; 455/42

[56] References Cited

U.S. PATENT DOCUMENTS

| 4,691,318 | 9/1987 | Entenman | 375/39 |
| 4,881,049 | 11/1989 | Yagi | 375/39 |
| 4,930,141 | 5/1990 | Ohmagari | 375/60 |
| 4,972,440 | 11/1990 | Ernst et al. | 375/60 |
| 4,990,867 | 2/1991 | Ogura et al. | 375/39 |

Primary Examiner—Stephen Chin
Attorney, Agent, or Firm—Ostrolenk, Faber, Gerb & Soffen

[57] ABSTRACT

A quadrature modulation circuit incorporated in a radio communication apparatus and selectively implementing transmission and reception in an analog mode or in a digital mode with a single circuitry. A VCO (Voltage Controlled Oscillator) or a frequency synthesizer including a VCO has an analog modulation capability and replaces a local oscillator included in a conventional modulator circuit for feeding an output thereof to a digital modulator.

11 Claims, 2 Drawing Sheets

QUADRATURE MODULATION CIRCUIT

BACKGROUND OF THE INVENTION

The present invention relates to a quadrature modulation circuit and, more particular to a quadrature modulation circuit applicable to a radio communication apparatus having an analog and digital transmission and reception capability.

A conventional quadrature modulation circuit of the type described at least includes a modulator for analog modulation, a modulator for digital modulation, and a switch for selecting either of the outputs of the two modulators. The problem is, therefore, that the two modulators have to be accompanied by various extra circuit parts including local oscillators, complicating the construction of the circuit. Further, the switch has to be switched at high frequency in selecting either of the outputs of the analog and digital modulators. To cope with noise particular to high frqency switching, the modulation circuit has to be provided with a special configuration.

SUMMARY OF THE INVENTION

It is therefore an object of the present invention to provide a quadrature modulation circuit for a radio communicatio apparatus which is capable of dealing with transmission and reception in both of analog and digital modes with single circuitry.

A quadrature modulation circuit of the present invention comprises a first and a second mixer, an adder for adding an output of the first mixer and an output of the second mixer to produce a predetermined signal, first inputting means respectively connected to one input of the first mixer and one input of the second mixer for receiving a signal for a quadrature modulation or a signal for a frequency modulation, second inputting means respectively connected to the other input of the first mixer and the other input of the second mixer, a controller connected to the other input of each of the first and second mixers for feeding either a carrier wave or an FM (Frequency Modulation) wave to the second inutting means in response to an input signal and a π/2 phase shifter connected between the controller and one of the first and second mixers and rendered conductive in an analog mode.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 3:
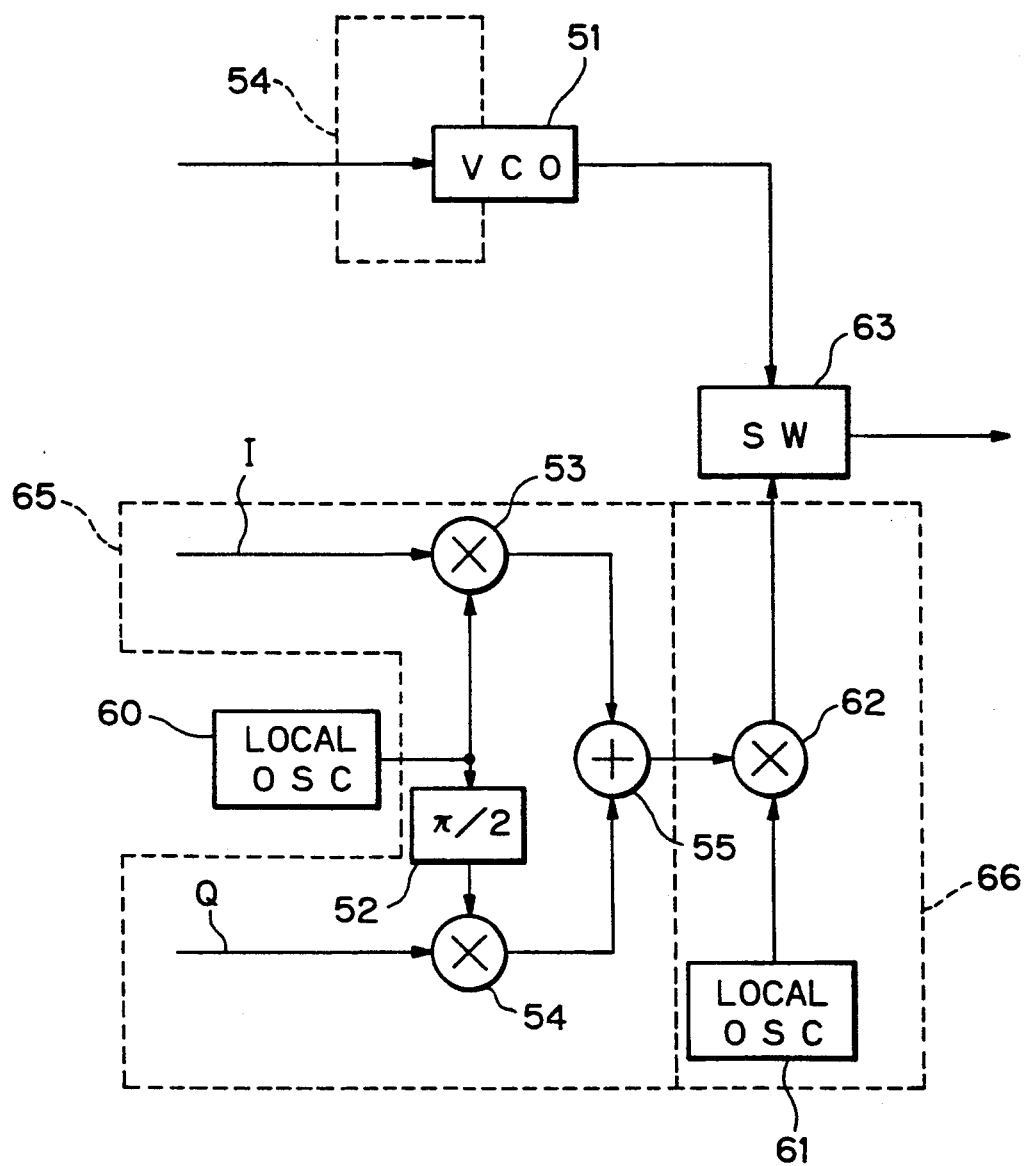
FIG. 3 is a schematic block diagram representative of a conventional quadrature modulation circuit.

To better understand the present invention, a brief reference will be made to a conventional modulation circuit for a radio communication apparatus having an analog and digital transmission and reception capability, shown in FIG. 3. As shown, the modulation circuit has a VCO (Voltage Controlled Oscillator) 51 including a modulator 54 for analog modulation (referred to as an analog modulator hereinafter), a modulator 65 for digital modulation (hereinafter referred to as a digital modulator) a local oscillator 60 feeding an output thereof to the digital modulator 65, a frequency converter 66 for converting the output frequency of the oscillator 60 to a desired frequency, and a switch 63 for selecting either the output of the VCO 51, i.e., the output of the analog modulator 54 or the output of the frequency converter 66, i.e., the output of the digital modulator 65. The digital modulator 65 is made up of a mixer 53 for mixing a digital signal I and the output of the local oscillator 60, a π/2 phase shifter 52 for shifting the output of the oscillator 60 by π/2 in phase, a mixer 54 for mixing a digital signal Q and the output of the phase shifter 52, and an adder 55 for adding the outputs of the mixers 53 and 54. The frequency converter 66 is constituted by a local oscillator 61 and a mixer 62 which mixes the output of the oscillator 61 and that of the digital modulator 65.

When an analog signal is applied to the modulation circuit having the above construction, the output of the VCO 51 of the analog modulator 54 is fed out via the switch 63 which has been connected to the modulator 54. When the input to the modulation circuit is a digital signal, the signals I and Q are fed to the mixers 53 and 54, respectively. The mixer 53 mixes the signal I with the output of the local oscillator 60 while the mixer 54 mixes the signal Q with the output of the π/2 phase shifter 52. The adder 55 adds the resulting outputs of the mixers 53 and 54 and then delivers the sum to the mixer 62. Then, the output of the mixer 62 is fed out via the switch 63 which has been brought into connection with the digital modulator 65.

As stated above, the conventional modulation circuit needs two modulators, i.e., analog modulator 54 and digital modulator 65. As a result, the local oscillators 60 and 61 and other extra circuit parts are required, scaling up the entire circuitry. Moreover, the switch 63 has to be switched at high frequency in selecting either of the outputs of the analog modulator 54 or the digital modulator 65. To cope with noise particular to high frequency switching, the modulation circuit has to be provided with a special configuration.

Figure 1:
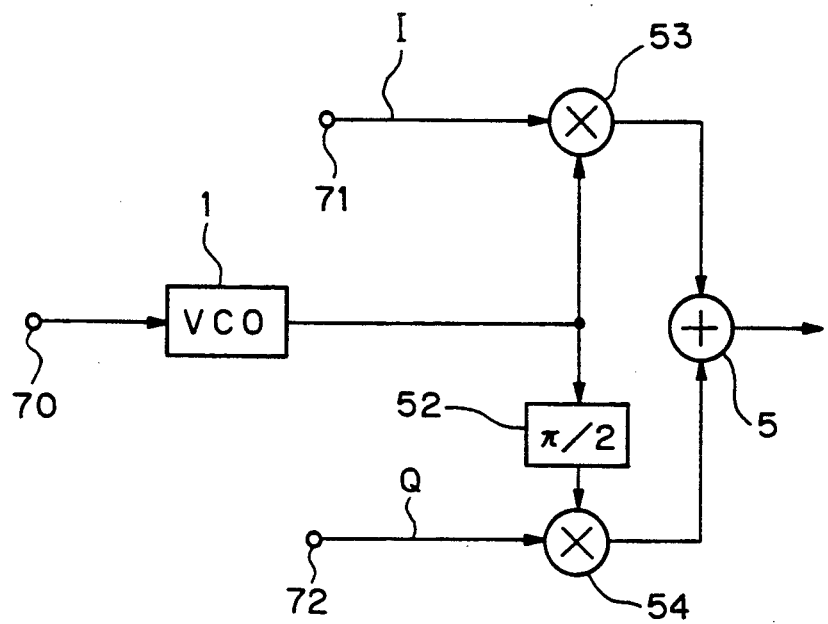
FIG. 1 is a block diagram schematically showing a quadrature modulation circuit embodying the present invention.

Referring to FIG. 1, a quadrature modulation circuit embodying the present invention is shown. In the figure, the same or similar constituents to those of the conventional circuit are designated by the same reference numerals, and a detailed description will be omitted to avoid redundancy. As shown, the modulation circuit has two mixers 53 and 54, an adder 5 for adding the outputs of the mixers 53 and 54 to produce a predetermined signal, input terminals 71 and 72 respectively connected to one input of the mixer 53 and one input of the mixer 54, and a VCO 1 connected to the other input of the mixers 53 and 54. An analog signal or a digital signal is applied to each of the input terminals 71 and 72. The VCO 1 has an input terminal 70 and produces a carrier wave or an FM (Frequency Modulation) wave in response to an input signal. A π/2 phase shifter 52 is connected between the VCO 1 and one of the mixers 53 and 54 and rendered conductive in an analog mode.

In operation, when a signal for a frequency modulation is received in an analog mode, it is applied to the input terminal 70 of the VCO 1 to be modulated in frequency thereby. The resulting FM signal is fed to the mixer 53 and π/2 phase shifer 52. A fixed voltage is applied to each of the input terminals 71 and 72. As a result, the modulation circuit produces an analog FM signal. Assume that the received signal is a signal requiring quadrature modulation. Then, if the input of the analog signal to the input terminal 70 of the VCO 1 is fixed, the VCO 1 produces an output in the form of an unmodulated wave. Therefore, when signals I and Q for a quadrature modulation are respectively applied to the input terminals 71 and 72, the modulation circuit produces a digital QPSK (Quadrature Phase Shift Keying) signal. Specifically, the VCO 1 having the analog modulation input terminal 70 simultaneously plays the role of the local oscillator 60, FIG. 3, for digital modulation included in the conventional circuitry, i.e., the two modulators 54 and 65 can be implemented by a single modulator.

Figure 2:
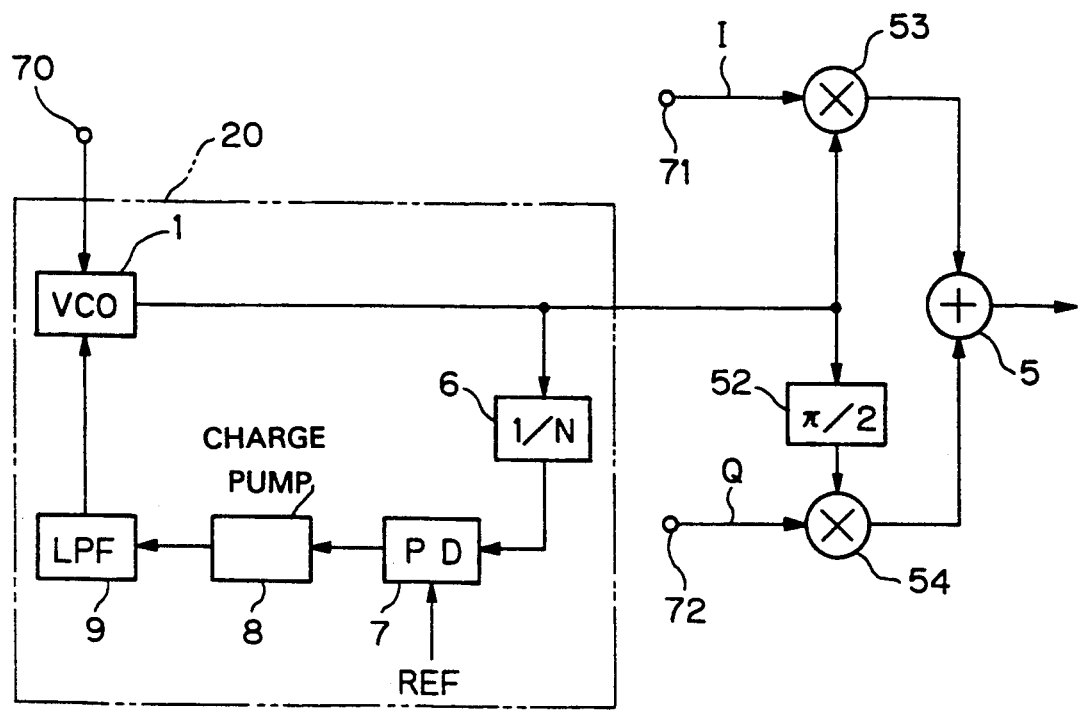
FIG. 2 is a block diagram schematically showing an alternative embodiment of the present invention.

FIG. 2 shows an alternative embodiment of the present invention which is characterized in that the VCO 1 is included in a frequency synthesizer 20. Specifically, the frequency synthesizer 20 is constituted by the VCO 1, a 1/N frequency divider 6, a phase detector 7, a charge pump 8, and a low pass filter 9. A signal for a frequency modulation which is received in an analog mode is applied to the frequency synthesizer 20 which then produces an analog FM signal. The analog FM signal is fed to the mixer 53 and π/2 phase shifter 52 while the input signals to the input terminals 71 and 72 are fixed. As a result, the modulation circuit outputs an analog FM signal. In a digital mode, the input to the frequency synthesizer 20 will be fixed to produce a digital QPSK signal in the same manner as in the previous embodiment.

In summary, it will be seen that the present invention provides a quadrature modulation circuit having a VCO (or a frequency synthesizer including a VCO) which has an analog modulation capability and replaces a local oscillator included in a conventional modulation circuit for feeding an output thereof to a digital modulator. This is successful in reducing the number of circuit parts including an oscillator. Moreover, since an analog modulator and a digital modulator are implemented by a single modulator, the circuit of the invention does not need high frequency switching.

Various modifications will become possible for those skilled in the art after receiving the teachings of the pesent disclosure without departing from the scope thereof.

What is claimed is:

1. A dual mode modulation circuit operable to produce both quadrature modulation and frequency modulation, comprising:
    a first and a second mixer;
    an adder for adding an output of said first mixer and an output of said second mixer to produce a predetermined signal;
    first inputting means respectively connected to one input of said first mixer and one input of said second mixer for receiving a signal for a quadrature modulation or a signal for a frequency modulation;
    second inputting means respectively connected to the other input of said first mixer and the other input of said second mixer;
    control means connected to said other input of each of said first and second mixers for feeding either a carrier wave or an FM wave to said second inputting means in response to an input signal; and
    a π/2 phrase shifter connected between said control means and one of said first and second mixers and rendered conductive in an analog mode.

2. A circuit as claimed in claim 1, wherein said first and second inputting means each comprises input terminals.

3. A circuit as claimed in claim 1, wherein said control means comprises a VCO.

4. A circuit as claimed in claim 1, wherein said control means comprises a frequency synthesizer.

5. A dual mode modulation circuit having analog and digital transmission and reception capability, the dual mode modulation circuit comprising:
    a pair of mixers including a first and second mixer, each mixer having a respective first input;
    an adder coupled to the mixers for producing an adder output which comprises a sum of outputs of said mixers;
    a frequency producing means for producing an output in a form that is selectively either a frequency modulated signal or a carrier signal, said frequency producing means including an input terminal;
    said mixers being electrically coupled to said frequency producing means; and
    said dual mode modulation circuit controlling said first input of said mixers and said input terminal of said frequency producing means to cause said adder output to output either an analog frequency modulated signal or a digital QPSK (Quadrature Phase Shift Keying) signal.

6. The dual mode modulation circuit of claim 5, wherein the frequency producing means is a VCO.

7. The dual mode modulation circuit of claim 6, wherein the output of the VCO is supplied directly to said first mixer, and including a 90° phase shift circuit disposed between the output of the VCO and the second mixer.

8. The dual mode modulation circuit of claim 5, wherein said dual mode modulation circuit is free of any high frequency switching device for switching between analog and digital signals.

9. The dual mode modulation circuit of claim 5, wherein said frequency producing means is a frequency synthesizer.

10. The dual mode modulation circuit of claim 6, including a feed-back circuit for said VCO, said feed-back circuit including a 1/N frequency divider, a phase detector, a charge pump, and a low pass filter arranged in series between the output of said VCO and another input terminal thereof.

11. A method for producing an output signal which selectively comprises an analog frequency modulated signal or a digital QPSK (Quadrature Phase Shift Keying) signal, the method including the steps of:
    providing a modulation circuit which includes a first mixer and a second mixer, each mixer having a respective first input, a respective second input and a respective output; an adder for adding the outputs of the first and second mixers; frequency producing means for producing an output frequency which is coupled to the second input of the first mixer and indirectly, through a phase shifter, to the second output of the second mixer, the frequency producing means including an input terminal; and
    selectively applying to the first input of the mixers and to the input terminal of the frequency producing means, either:
    a) a fixed voltage to the first input of the first and second mixer and an analog, modulated signal to the input terminal of the frequency producing means; or
    b) a fixed signal to the input terminal of the frequency producing means and signals I and Q, respectively, to the first input of the first and second mixer.

* * * * *